(12) United States Patent
Jung

(10) Patent No.: US 9,552,883 B1
(45) Date of Patent: Jan. 24, 2017

(54) SEMICONDUCTOR MEMORY DEVICE AND OPERATING METHOD THEREOF

(71) Applicant: SK hynix Inc., Gyeonggi-do (KR)

(72) Inventor: Sung Wook Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/990,230

(22) Filed: Jan. 7, 2016

(30) Foreign Application Priority Data

Jul. 23, 2015 (KR) .................. 10-2015-0104583

(51) Int. Cl.
*G11C 11/34* (2006.01)
*G11C 16/12* (2006.01)
*G11C 16/34* (2006.01)

(52) U.S. Cl.
CPC ........... *G11C 16/12* (2013.01); *G11C 16/3459* (2013.01)

(58) Field of Classification Search
CPC ............................ G11C 16/12; G11C 16/3459
USPC ............. 365/185.18, 185.19, 185.22, 185.24
See application file for complete search history.

(56) References Cited

U.S. PATENT DOCUMENTS

| | | | | |
|---|---|---|---|---|
| 5,440,550 A * | 8/1995 | Follett | ................. | H04L 12/5601 340/2.1 |
| 6,246,610 B1 * | 6/2001 | Han | ........................ | G11C 16/10 365/185.22 |
| 6,292,394 B1 * | 9/2001 | Cohen | ................. | G11C 16/3436 365/185.03 |
| 7,656,710 B1 * | 2/2010 | Wong | ................... | G11C 11/5628 365/185.18 |
| 2003/0235080 A1 * | 12/2003 | Yaegashi | ............ | G11C 16/3468 365/185.22 |
| 2005/0265073 A1 * | 12/2005 | Chae | ...................... | G11C 16/12 365/185.03 |
| 2005/0270848 A1 * | 12/2005 | Chae | ...................... | G11C 16/30 365/185.23 |
| 2006/0120165 A1 * | 6/2006 | Hemink | .............. | G11C 11/5628 365/185.28 |
| 2006/0274564 A1 * | 12/2006 | Kim | ....................... | G11C 16/12 365/100 |
| 2006/0274583 A1 * | 12/2006 | Lutze | ..................... | G11C 16/12 365/185.28 |
| 2007/0253256 A1 * | 11/2007 | Aritome | .............. | G11C 11/5628 365/185.24 |
| 2007/0268773 A1 * | 11/2007 | Aritome | ................... | G11C 8/10 365/230.06 |

(Continued)

FOREIGN PATENT DOCUMENTS

| | | |
|---|---|---|
| KR | 1020090096862 | 9/2009 |
| KR | 1020150003969 | 1/2015 |

*Primary Examiner* — Viet Q Nguyen
(74) *Attorney, Agent, or Firm* — IP & T Group LLP

(57) ABSTRACT

A semiconductor memory device includes a plurality of memory cells connected to a plurality of word lines; a peripheral circuit suitable for applying a program pulse to at least one of the word lines, performing a program verification operation to the plurality of memory cells by using a first program verification voltage; and a control logic suitable for controlling the peripheral circuit to repeat the applying of the program pulse and the performing the program verification operation until program verification passes by increasing a level of the program pulse by an amount of a step voltage at each repetition, wherein a size of the step voltage decreases at each repetition.

18 Claims, 7 Drawing Sheets

(56) References Cited

U.S. PATENT DOCUMENTS

| | | | |
|---|---|---|---|
| 2008/0084751 A1* | 4/2008 | Li | G11C 11/5628 365/185.19 |
| 2008/0094910 A1* | 4/2008 | Sim | G11C 16/3404 365/185.22 |
| 2008/0205137 A1* | 8/2008 | Yanagidaira | G11C 11/5628 365/185.03 |
| 2008/0247236 A1* | 10/2008 | Lee | G11C 16/3454 365/185.19 |
| 2008/0313387 A1* | 12/2008 | Shibata | G11C 16/26 711/103 |
| 2009/0003075 A1* | 1/2009 | Kim | G11C 16/10 365/185.19 |
| 2009/0207664 A1* | 8/2009 | Kim | G11C 16/12 365/185.19 |
| 2009/0285028 A1* | 11/2009 | Park | G11C 16/10 365/185.19 |
| 2010/0046297 A1* | 2/2010 | Cernea | G11C 11/5628 365/185.18 |
| 2010/0218073 A1* | 8/2010 | Kang | G06F 11/1048 714/764 |
| 2010/0259993 A1* | 10/2010 | Kang | G11C 11/5628 365/185.22 |
| 2010/0329013 A1* | 12/2010 | Shikata | G11C 16/0483 365/185.18 |
| 2011/0161571 A1* | 6/2011 | Kim | G11C 11/5628 711/103 |
| 2011/0194353 A1* | 8/2011 | Hwang | G11C 11/5628 365/185.19 |
| 2013/0016558 A1* | 1/2013 | Ahn | G11C 16/3459 365/185.03 |
| 2013/0135937 A1* | 5/2013 | Sakui | G11C 11/5628 365/185.19 |
| 2014/0104950 A1* | 4/2014 | Yano | G11C 16/10 365/185.12 |

* cited by examiner

SEMICONDUCTOR MEMORY DEVICE AND OPERATING METHOD THEREOF

CROSS-REFERENCE TO RELATED APPLICATION

The present application claims priority to Korean patent application number 10-2015-0104583 filed on Jul. 23, 2015, the entire disclosure of which is incorporated herein in its entirety by reference.

BACKGROUND

Field of Invention

Various embodiments of the present disclosure relate to an electronic device, and more particularly, to a semiconductor memory device and an operating method thereof.

Description of Related Art

Semiconductor memory devices are memory devices realized using a semiconductor such as silicon (Si), germanium (Ge), gallium arsenide (GaAs), Indium phosphide (InP), or the like. Semiconductor memory devices are classified into volatile memory devices and nonvolatile memory devices.

Volatile memory devices generally lose stored data rather rapidly when power is turned off. Representative examples of volatile memory devices include static RAM (SRAM), dynamic RAM (DRAM), synchronous DRAM (SDRAM), etc. Nonvolatile memory devices retain data stored therein even when power is turned off. Representative examples of nonvolatile memory devices include read-only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory is typically classified into NOR type and NAND type memory.

SUMMARY

Various embodiments of the present disclosure are directed to a semiconductor memory device having enhanced program speed and reliability, and an operating method thereof.

One embodiment of the present disclosure provides a method of operating a semiconductor memory device including a plurality of memory cells connected to a word line, the method comprising: applying a program pulse to the word line; performing a program verification operation to the plurality of memory cells using a first program verification voltage; and repeating the applying of the program pulse and the performing the program verification operation until program verification passes by increasing a level of the program pulse by an amount of a step voltage at each repetition, wherein a size of the step voltage decreases at each repetition.

Another embodiment of the present disclosure provides a semiconductor memory device including: a plurality of memory cells connected to a plurality of word lines; a peripheral circuit suitable for applying a program pulse to at least one of the word lines, performing a program verification operation to the plurality of memory cells by using a first program verification voltage; and a control logic suitable for controlling the peripheral circuit to repeat the applying of the program pulse and the performing the program verification operation until program verification passes by increasing a level of the program pulse by an amount of a step voltage at each repetition, wherein a size of the step voltage linearly decreases at each repetition.

BRIEF DESCRIPTION OF THE DRAWINGS

Example embodiments will now be described more fully hereinafter with reference to the accompanying drawings; however, it should be understood that the invention may be embodied in different forms and that it should not be construed as limited to the embodiments set forth herein.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
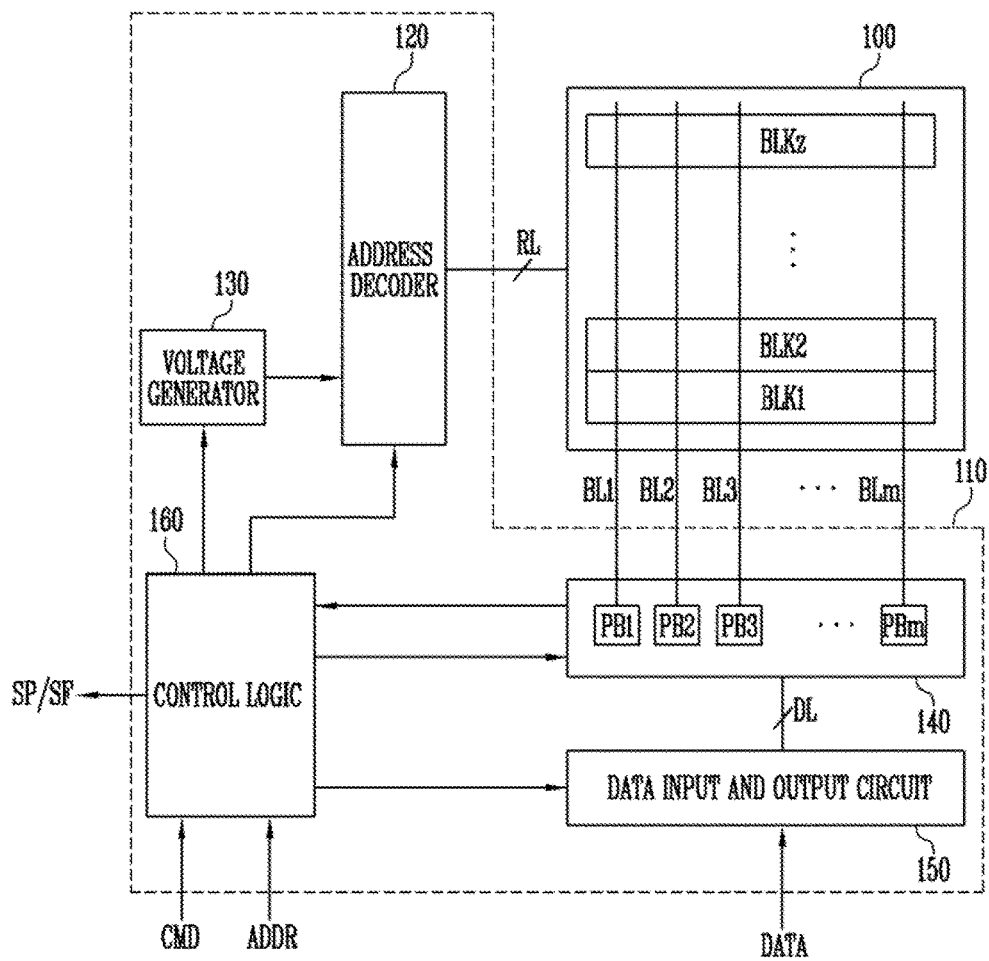
FIG. 1 is a block diagram illustrating a semiconductor memory device, according to an embodiment of the invention.

The invention will now be described with reference to specific embodiments illustrated in the accompanying drawings. It should be understood, however, that the invention may be embodied in many other different variations and forms falling within the scope of the invention and should therefore not be construed as being limited to the specific embodiments set forth herein in any way.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element, or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include" and "have" when used in this specification are open ended terms that specify the presence of stated features, integers, steps, operations, elements, components, and/or combinations thereof, but do not preclude the presence or addition of one or more other features, integers, steps, operations, elements, components, and/or combinations thereof.

Unless otherwise defined, all terms including technical and scientific terms used herein have the same meaning as commonly understood by a person of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Detailed description of functions and structures well known to those skilled in the art are omitted to avoid obscuring the subject matter of the present disclosure. This aims to omit unnecessary description so as to make the subject matter of the present disclosure clear.

Hereinafter, exemplary embodiments of the present disclosure will be described with reference to the accompanying drawings.

Figure 2:
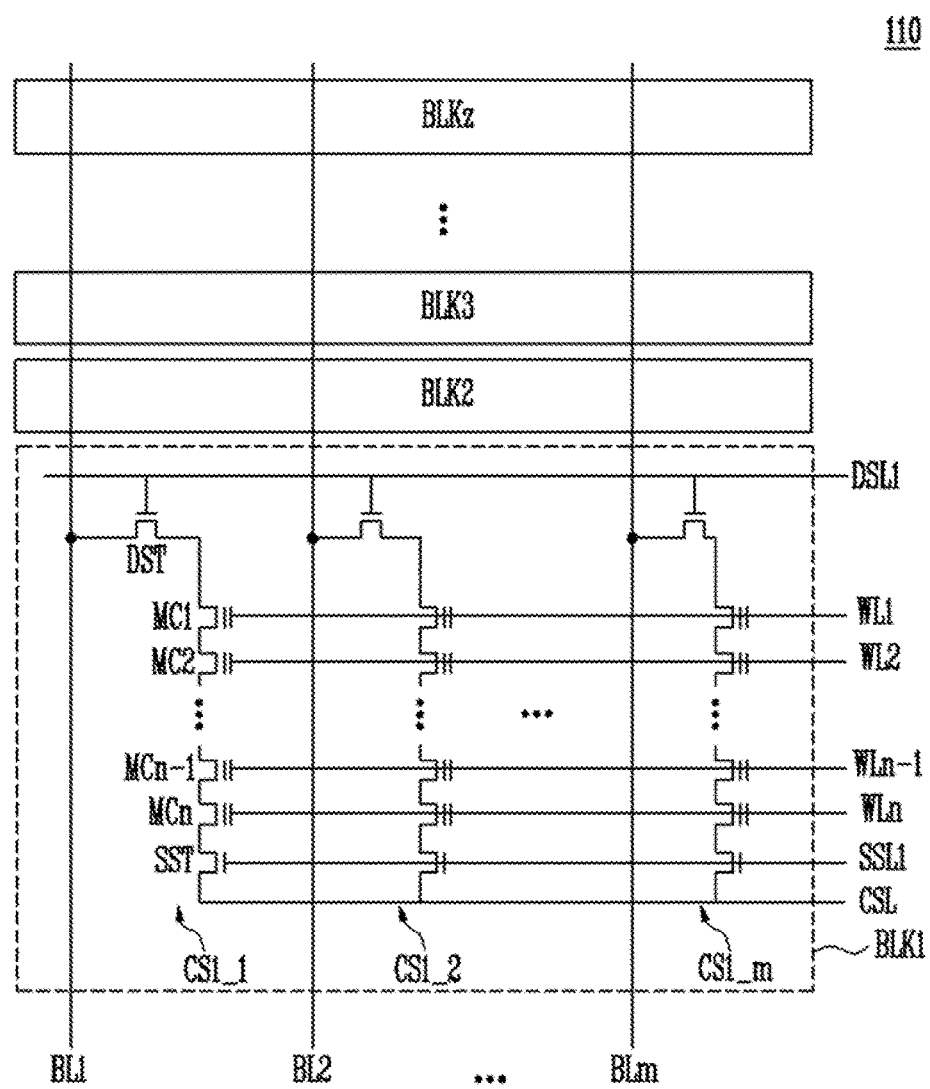
FIG. 2 is a block diagram illustrating a cell array, according to an embodiment of the invention.

Referring now to FIGS. 1 and 2 a block diagram illustrating a semiconductor memory device 50 is provided, according to an embodiment of the present disclosure.

The semiconductor memory device 50 includes a memory cell array 100 and a peripheral circuit 110.

The memory cell array 100 includes a plurality of memory blocks BLK1 to BLKz. The memory blocks BLK1 to BLKz are connected to an address decoder 120 through one or more row lines RL. The memory blocks BLK1 to BLKz are also connected to a read-and-write circuit 140 through one or more bit lines BL1 to BLm. Each of the memory blocks BLK1 to BLKz may include a plurality of memory cells MC1 to MCn as shown in FIG. 2. The memory cells may be non-volatile memory cells. The memory cells may be volatile memory cells. Employing non-volatile memory cells may be preferred because the stored data may be retained even when the power is turned off.

The memory cell array 100 may comprise one or more other blocks, such as, for example, a main block and/or an extra block. Various pieces of setting information about the operation of the memory cells may be stored in the extra block. For example, the extra block may include a content-addressable memory (CAM) region. The CAM region may store information needed for the general operation of the semiconductor memory device 50 such as, for example, information of a read voltage, a program pulse voltage, various pieces of offset information, and the like.

Referring now to FIG. 2, the memory blocks BLK1 to BLKz are connected in common to the bit lines BL1 to BLm. In FIG. 2, for avoiding unnecessary repetition, elements of only the first memory block BLK1 are illustrated. It should be understood that each of the remaining memory blocks BLK2 to BLKz may include the same elements and may have the same configuration as the first memory block BLK1.

The memory block BLK1 includes a plurality of cell strings CS1_1 to CS1_$m$. The first to m-th cell strings CS1_1 to CS1_$m$ are connected to the first to m-th bit lines BL1 to BLm, respectively. For example, the CS1_1 cell string is connected to the BL1 bit line, the CS1_2 cell string is connected to the BL2 bit line and likewise each of the remaining cell strings is connected to a corresponding bit line.

Each of the CS1_1 to CS1_$m$ includes a drain selection transistor DST, a plurality of memory cells MC1 to MCn, the memory cells being connected in series to each other, and a source selection transistor SST. The drain selection transistor DST is connected to a drain selection line DSL1. The first to n-th memory cells MC1 to MCn are connected to first to n-th word lines WL1 to WLn respectively. The source selection transistor SST is connected to a source selection line SSL1. A drain side of the drain selection transistor DST is connected to a corresponding bit line. The drain selection transistors of the first to m-th cell strings CS1_1 to CS1-$m$ are connected to the first to m-th bit lines BL1 to BLm, respectively. The source side of the source selection transistor SST is connected to a common source line CSL. In an embodiment, a common source line CSL may be connected in common to the first through z-th memory blocks BLK1 to BLKz.

The drain selection line DSL1, the first to n-th word lines WL1 to WLn, and the source selection line SSL1 are included in the row lines RL of FIG. 1. The drain selection line DSL1, the first to n-th word lines WL1 to WLn, and the source selection line SSL1 are controlled by the address decoder 120. The common source line CSL is controlled by a control logic 160. The first to m-th bit lines BL1 to BLm are controlled by the read-and-write circuit 140.

Referring again to FIG. 1, the peripheral circuit 110 includes the address decoder 120, a voltage generator 130, the read-and-write circuit 140, a data input-and-output circuit 150 and the control logic 160.

The address decoder 120 is connected to the memory cell array 110 through the row lines RL. The address decoder 120 is configured to be operated under the control of the control logic 160.

The address decoder 120 receives addresses ADDR through the control logic 160. Program operation of the semiconductor memory device 50 is performed in a unit of a word line. During program operation, the addresses ADDR may include a block address and a row address. The address decoder 120 is configured to decode a block address among the provided addresses ADDR. The address decoder 120 selects one of the memory blocks BLK1 to BLKz according to the decoded block address.

The address decoder 120 is configured to decode a row address among the provided addresses ADDR. According to the row address, the address decoder 120 applies voltages, which are provided from the voltage generator 130, to one of the first to n-th word lines WL1 to WLn of the row lines RL for the selected memory block. During the program operation, the address decoder 120 may apply a program pulse to the selected word line and apply a pass pulse having a lower voltage level than the program pulse to non-selected word lines. During a program verification operation, the address decoder 120 may apply a program verification voltage to a selected word line and apply a pass voltage higher than the program verification voltage to non-selected word lines.

In an embodiment, the address decoder 120 may include an address buffer, a block decoder and a row decoder.

The voltage generator 130 is configured to generate a plurality of voltages from the external power voltage that is applied to the semiconductor memory device 50. The voltage generator 130 operates under the control of the control logic 160.

In an embodiment, the voltage generator 130 may produce an internal power voltage by regulating an external power voltage. The internal power voltage produced in the voltage generator 130 is used as the operating voltage for the semiconductor memory device 50.

In an embodiment, the voltage generator 130 may produce a plurality of voltages by using the external power voltage or the internal power voltage. For example, the voltage generator 130 may include a plurality of pumping capacitors that receive the internal power voltage and produce a plurality of voltages by selectively activating the plurality of pumping capacitors under the control of the control logic 160. The produced voltages are applied to the first to n-th word lines WL1 to WLn by the address decoder 120. During program operation, the voltage generator 130 may produce a program pulse having a high voltage and a pass pulse lower than the program pulse in voltage level. During a program verification operation, the voltage generator 130 may produce a program verification voltage and a program verification pass voltage higher than the program verification voltage.

The read-and-write circuit 140 includes first to m-th page buffers PB1 to PBm. The first to m-th page buffers PB1 to PBm are connected to the memory cell array 110 through the first to m-th bit lines BL1 to BLm, respectively. The first to m-th page buffers PB1 to PBm operate under the control of the control logic 160.

The first to m-th page buffers PB1 to PBm exchange data with the data input-and-output circuit 150. During the program operation, the first to m-th page buffers PB1 to PBm receive data DATA to be stored into the memory cell array 100 through the data input-and-output circuit 150 and data lines DL. When a program pulse is applied to a selected word line, the first to m-th page buffers PB1 to PBm may transmit data DATA to be stored to selected memory cells through the bit lines BL1 to BLm. A memory cell connected to a bit line to which a program permission voltage (for example, a ground voltage) is applied may have an increased threshold voltage. A threshold voltage of a memory cell connected to a bit line to which a program inhibition voltage (for example, a supply voltage) is applied may be maintained. During the program verification operation, the first to m-th page buffers PB1 to PBm read page data from selected memory cells through the bit lines BL1 to BLm.

In an embodiment, the read-and-write circuit 140 may include a row selection circuit.

The data input-and-output circuit 150 is connected to the first to m-th page buffers PB1 to PBm through the data lines DL. The data input-and-output circuit 150 operates under the control of the control logic 160. During the program operation, the data input-and-output circuit 150 receives data DATA to be stored into the memory cell array 100 from a controller such as an external controller (not shown).

The control logic 160 is connected to the address decoder 120, the voltage generator 130, the read-and-write circuit 140, and the data input-and-output circuit 150. The control logic 160 receives a command CMD and addresses ADDR from the controller. The control logic 160 is configured to control the address decoder 120, the voltage generator 130, the read-and-write circuit 140, and the data input-and-output circuit 150 in response to the command CMD. The control logic 160 transmits the addresses ADDR to the address decoder 120.

According to an embodiment of the present disclosure, when receiving a command CMD with instructions to perform a program operation (hereinafter, referred to as a program command), the peripheral circuit 110 may perform the program operation to selected one or more memory cells. During program operation, a program voltage (i.e., a pulse) may be applied to a selected word line. In an embodiment, the level of a program start voltage that is first applied to the memory cell array 100 may depend on the value stored in the CAM region of the memory cell array 100. After the program voltage is applied, the program verification operation is performed to selected memory cells. When the program verification fails despite of a predetermined repetition number of the program operation and the program verification operation, a fail-state signal is outputted to the controller.

When the program verification passes i.e. is successful, the peripheral circuit 110 applies a dummy pulse, which is a program applied at the program verification pass, to the selected word line and outputs a pass-state signal SP to the controller.

Page data read from the selected memory cells may be temporarily stored in the first to m-th page buffers PB1 to PBm during the program verification operation. The first to m-th page buffers PB1 to PBm may transmit a program verification result to the control logic 160 under the control of the control logic 160.

The control logic 160 may change the program pulse voltage to be applied to the selected word line according to the program verification result.

When program verification fails, the control logic 160 may reset the program pulse voltage. As the reset of the program pulse voltage, the control logic 160 may increase the program pulse voltage to be applied by a step voltage over the previously applied program pulse voltage. The step voltage is linearly reduced every time the program pulse voltage is reset.

When program verification passes, the control logic 160 may determine the voltage of a dummy pulse to be applied. The dummy pulse voltage may have be a value increased by a preset reference value over the latest program pulse voltage applied when the program verification last passed.

Furthermore, when applying the dummy pulse voltage to the selected word line at the program verification pass (in the case where program verification succeeds), the control logic 160 may control the data input-and-output circuit 150 to apply a program control voltage, which is higher than the program allowable voltage and lower than the program inhibition voltage, to the bit lines connected to the selected memory cells.

The control logic 160 may control the voltage generator 130 and the address decoder 120 to apply the dummy pulse to the selected word line and output the pass-state signal SP to the controller that controls the semiconductor memory device 50.

Figure 3:
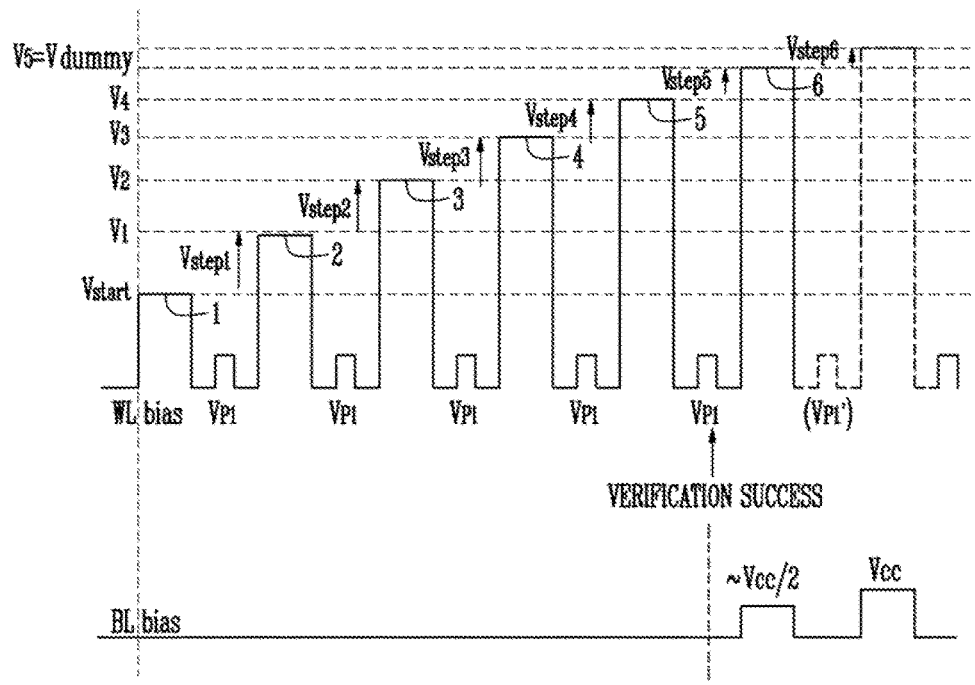
FIG. 3 is a view illustrating a program pulse voltage of a semiconductor memory device, according to an embodiment of the invention.

FIG. 3 illustrates a program pulse voltage, according to an embodiment of the present disclosure.

The program operation is performed by repeating the program operation using the program pulse and the program verification operation using the program verification voltage. During a program verification operation to selected memory cells, a double verification operation using two program verification voltages for each program loop may be used. The double verification operation includes: detecting threshold voltages of the selected memory cells twice using a second program verification voltage, which is a target program verification voltage, and a first program verification voltage, which is lower than the target program verification voltage; and classifying the memory cells into first memory cells having lower threshold voltage than the first program verification voltage, second memory cells having a threshold voltage higher than the first program verification voltage and lower than the second program verification voltage, and third memory cells having a higher threshold voltage than the second program verification voltage, according to a result of the detection. As a result of the double verification operation, the control logic 160 may reset the program pulse voltage for the first and second memory cells which have lower threshold voltage than the second program verification voltage. For example, the control logic 160 may increase the program pulse voltage to be applied by a step voltage over the previously applied program pulse voltage. The step voltage may be linearly reduced each time the control logic resets the program pulse voltage. The reset of the program pulse voltage may be implemented by incremental step pulse programming (ISSP). The incremental step pulse programming method includes applying a pulse increased by a predetermined step voltage during every iteration of the program operation. The reset of the program pulse voltage may be repeated a predetermined number of times until the program verification passes. For example, the first and second memory cells which are lower in threshold voltage than the second verification voltage may repeatedly perform a programming operation using an ISSP method of reprogramming using a program voltage which is higher than the program voltage used during the previous program operation.

In the case of flash memory, it may be generally advantageous to reduce program time (time of the program operation and the program verification operation) in order to improve the performance of the semiconductor memory device 50. On the other hand, there is also a need to improve the distribution of threshold voltages for each program state. Typically, when the program time is reduced, the distribution of the threshold voltages deteriorates, while the program time should be increased in order to improve the distribution of threshold voltages.

An embodiment of the invention proposes a programming method for reducing the program time while improving the distribution of threshold voltages by increasing the program pulse voltage to be applied over the previously applied program pulse voltage by a step voltage, the step voltage being reduced, for example, linearly each time of the increase of the program pulse voltage. For example, when a program pulse is applied, a pulse voltage increased by a step voltage over the voltage level of the previous pulse is applied wherein the step voltage is gradually reduced every time the program pulse is applied. This way the programming time may be reduced while also improving the distribution of the threshold voltages.

FIG. 3 illustrates an example of a voltage of a program pulse applied to program selected memory cells in a first program state PV1.

The level of a first program pulse 1 which is first applied to the selected word line may be a program start voltage Vstart. Thereafter, threshold voltages of the memory cells are verified by using a program verification voltage Vpv1 for the first program state PV1. The level of the program verification voltage Vpv1 may be lower than the minimum level of the threshold voltage distribution of a target program state (e.g., the first program state PV1). When the threshold voltages of the selected memory cells do not reach the program verification voltage, a second program pulse 2 is applied to the selected word line.

The level of the second program pulse 2 that is secondly applied may be a first program voltage V1, which is increased by a first step voltage Vstep1 over the program start voltage Vstart, which is the first program pulse 1. The first step voltage Vstep1 may be greater than difference between the maximum value and minimum value of the threshold voltage distribution of the target program state.

After the application of the second program pulse 2, the program verification operation is performed to the memory cells of the selected word line. When the threshold voltages of the memory cells do not reach the program verification voltage, a third program pulse 3 is applied to the selected word line.

The level of the third program pulse 3, which is thirdly applied, may be a second program voltage V2, which is increased by a second step voltage Vstep2 over the first program voltage V1, which is the second program pulse 2. The level of the second step voltage Vstep2 may be less than that of the first step voltage Vstep1. In the present embodiment, although the level of the pulse voltage is increased as the program operations proceed, the increment is reduced. That is, every time each program operation is performed, the level of the corresponding step voltage may be reduced.

The level of the fourth program pulse 4, which is fourthly applied, may be a third program voltage V3 which is increased by a third step voltage Vstep3 over the second program voltage V2, which is the third program pulse 3. The level of the third step voltage Vstep3 may be less than that of the second step voltage Vstep2. Furthermore, the difference between the second step voltage Vstep2 and the first step voltage Vstep1 may be the same as the difference between the third step voltage Vstep3 and the second step voltage Vstep2. In other words, every time a program pulse is applied, the level of the step voltage may be linearly reduced. The voltage level of the program pulse in accordance with the above-described method is expressed as the following equation 1.

$$V_n = V_{n-1} + (V_{step1} - k(n-2))[V] \quad \text{[Equation 1]}$$

where $V_1 = V_{start}$, n=2, 3, 4, ..., and k=constant.

Here, "n" denotes the application sequence of the program pulse, "Vstart" denotes the program start voltage, "Vstep1" denotes a first step voltage, and "k" is an arbitrary constant. When "k" is zero, the size or the level of the step voltage is kept constant. As "k" is increased, decrement size of the step voltage becomes greater. The value of "k" may vary depending on the characteristics of the memory cells.

The calculation of the program pulse voltage using the equation 1 may continue until the program verification succeeds.

Referring to FIG. 3, the level of the fifth program pulse 5, which is fifthly applied, may be a fourth program voltage V4, which is increased by a fourth step voltage Vstep4 over the third program voltage V3, which is the fourth program pulse 4. The level of the fourth step voltage Vstep4 may be less than that of the third step voltage Vstep3. FIG. 3 illustrates the program verification pass that the threshold voltages of the memory cells are higher than the program verification voltage by the application of the fifth program pulse 5 during the program verification operation.

When the program verification succeeds, the semiconductor memory device 50 may apply the dummy pulse. When the threshold voltages of the memory cells are higher than the program verification voltage Vp1 as the program verification succeeds, the threshold voltages of the memory cells may fall in between the program verification voltage and the minimum value of the threshold voltage distribution of the target program state. Therefore, it can be expected that the memory cells are programmed to the target program state by applying the dummy pulse once at the program verification pass. The voltage level of the dummy pulse may be higher than that of the last program pulse at the program verification pass (e.g., the fifth program pulse 5 shown in FIG. 3) by a preset value. This can be expressed as the following equation 2.

$$V_{dummy}=V_p+V_{ref}[V]$$ [Equation 2]

Equation 2 represents the voltage Vdummy of the dummy pulse. Here, "Vp" denotes the voltage level of the lastly applied program pulse at the program verification pass, and "Vref" denotes the preset value.

FIG. 3 exemplarily shows the preset value Vref as a fifth step voltage Vstep5 and the dummy pulse as a sixth program pulse 6. As shown in FIG. 3, the voltage Vdummy of the sixth program pulse 6 is higher than the fifth program pulse 5 by the fifth step voltage Vstep5 or the preset value Vref. The level of the fifth step voltage Vstep5 or the preset value Vref may be the difference between the lastly applied program verification voltage and a median value of the threshold voltage distribution of the target program state.

After the sixth program pulse 6 which is the dummy pulse has been applied, the program operation for the selected memory cells is completed.

In various embodiments, an additional program verification operation may be performed after the dummy pulse has been applied.

The program verification operation may be divided into a main program verification operation using the program verification voltage Vp1, which is described above, and a sub-program verification operation using a sub-program verification voltage Vp1'. After the main program verification operation has passed and the dummy pulse (i.e., the sixth program pulse 6 exemplified in FIG. 3) has been applied, the sub-program verification operation may be performed so as to reliably ensure the target program state. The program verification voltage Vp1 may be lower than the sub-program verification voltage Vp1'. The sub-program verification voltage Vp1' may be any one of the median value or the minimum value of the threshold voltage distribution of the target program state.

In various embodiments, when the dummy pulse is applied to the selected word line after the program verification has passed, the program control voltage may be applied to bit lines connected to the selected memory cells. That is, before program verification passes, the program allowable voltage 0V is applied to the bit lines connected to the selected memory cells. However, after the program verification has passed, the program control voltage, which is higher than 0V and lower than a power supply voltage Vcc, may be applied to the bit lines connected to the selected memory cells. The power supply voltage Vcc may be the program inhibition voltage. Thereby, the threshold voltages of the memory cells can be prevented from undesirably increasing to an excessively high level. The threshold voltages of the selected memory cells may be distributed within a relatively narrow range. The program control voltage applied to the bit lines of the selected memory cells may be a half (Vcc/2) of the power supply voltage Vcc. After the program operation has been completed, the program inhibition voltage Vcc may be applied to the bit lines connected to the selected memory cells.

Figure 4:
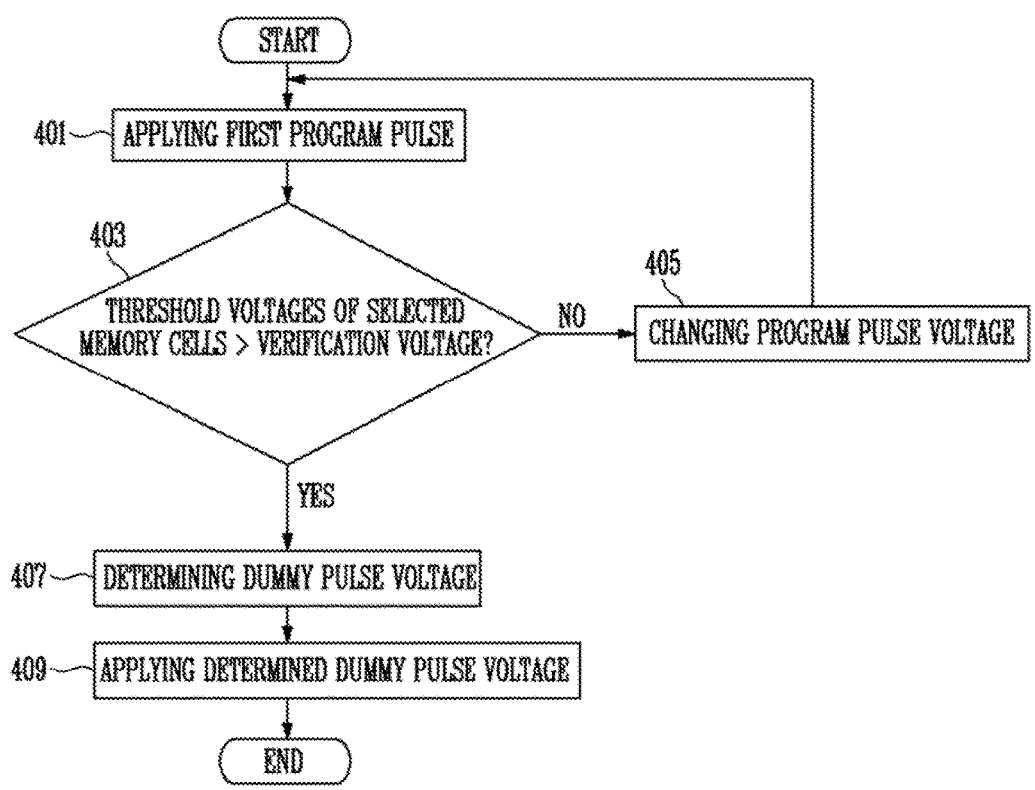
FIG. 4 is a flowchart showing a method of programming a semiconductor memory device, according to an embodiment of the invention.

FIG. 4 is a flowchart showing a method of programming the semiconductor memory device 50 according to an embodiment of the present disclosure.

Referring to FIGS. 1 to 4, at step 401, the semiconductor memory device 50 applies a first program pulse to a selected word line. The level of the first program pulse may be the program start voltage Vstart. The program start voltage Vstart may be determined based on the value stored in the CAM region of the memory cell array 100.

At step 403, the semiconductor memory device 50 performs the program verification operation to the selected memory cells. The program verification operation is performed in such a way that the memory cells are read according to the program verification voltage applied to the selected word line and it is determined whether the threshold voltages of the memory cells are higher than the program verification voltage. When the threshold voltages of the memory cells are higher than the program verification voltage, the program verification is determined as success. When the threshold voltages of a predetermined number or more of memory cells are not higher than the program verification voltage, the program verification is determined as failed.

At step 405, when the program verification is determined as failed, the semiconductor memory device 50 changes the voltage level of the program pulse according to the above described equation 1. For example, the control logic 160 may control the voltage generator 130 to generate the changed program pulse. As described with reference to FIG. 3 and equation 1, in an embodiment of the present disclosure, the program pulse is increased at each application by a step voltage Vstep1 to Vstep4, which is gradually reduced at each application of the program pulse. In various embodiments, the step voltage Vstep1 to Vstep4 may be linearly reduced every time the program pulse is applied.

At step 407, when the program verification is determined as successful, the semiconductor memory device 50 may determine the voltage of the dummy pulse. That is, when the threshold voltages of the memory cells are higher than the program verification voltage, the threshold voltages of the memory cells may fall in between the program verification voltage and the minimum value of the threshold voltage distribution of the target program state. Therefore, it can be expected that the memory cells will be programmed to the target program state by applying the dummy pulse once at the program verification pass. Here, the voltage level of the dummy pulse may be determined according to equation 2 as described above. That is, the voltage level of the dummy pulse may be higher than that of the last program pulse at the program verification pass (e.g., the fifth program pulse 5 shown in FIG. 3) by the preset value. The preset value may be the difference between the lastly applied program verification voltage and the median value of the threshold voltage distribution of the target program state.

At step 409, the semiconductor memory device 50 applies the determined dummy pulse voltage to the selected word line, thus completing the program operation. After the program operation has been completed, the program inhibition voltage Vcc may be applied to the bit lines connected to the selected memory cells.

In various embodiments, when the dummy pulse is applied after the program verification has passed, the semiconductor memory device 50 applies the program control voltage, which is higher than 0V and lower than the power supply voltage Vcc, to the bit lines connected to the selected memory cells. The threshold voltages of the memory cells can be prevented from undesirably increasing to an excessively high level by applying the program control voltage to the bit lines. Thereby, the selected memory cells can be programmed such that the threshold voltages of the selected memory cells are distributed in a relatively narrow range. The program control voltage applied to the bit lines of the selected memory cells may be one half (Vcc/2) of the power supply voltage Vcc.

In various embodiments, although not shown, the semiconductor memory device 50 may further perform the sub-program verification operation after step 409, as well as performing the main program verification operation of step 403, as described above. As such, the semiconductor memory device 50 may use two or more program verification voltages to verify the target program state.

As described above, the program verification operation may be divided into the main program verification operation using the program verification voltage Vp1, and the sub-program verification operation using the sub-program verification voltage Vp1'. After the main program verification operation has passed and the dummy pulse (i.e., the sixth program pulse 6 exemplified in FIG. 3) has been applied, the sub-program verification operation may be performed so as to reliably ensure the target program state. The program verification voltage Vp1 may be lower than the sub-program verification voltage Vp1'. The sub-program verification voltage Vp1' may be any one of the median value or the minimum value of the threshold voltage distribution of the target program state.

Figure 5:
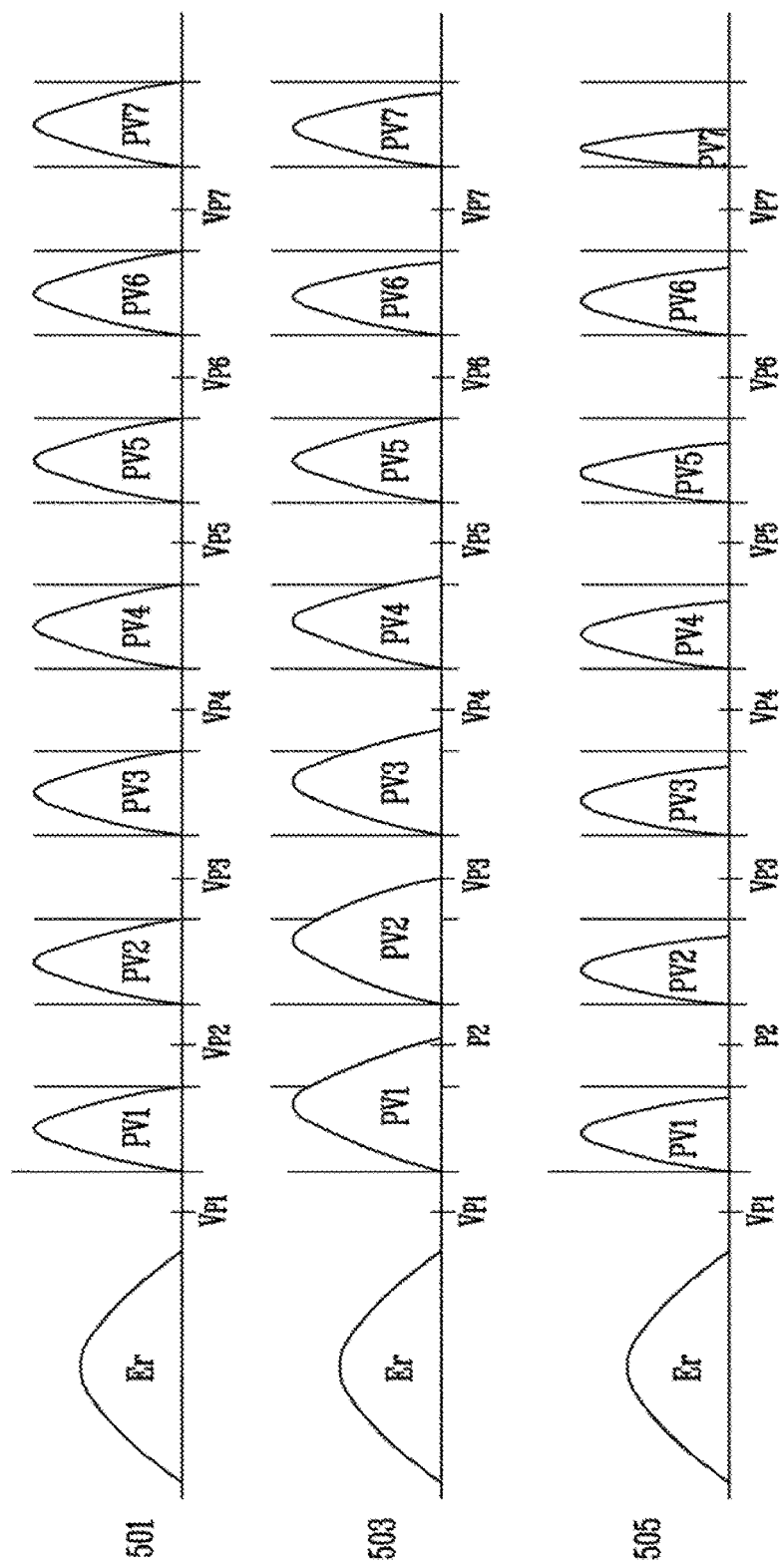
FIG. 5 illustrates threshold voltages of memory cells programmed by the method of FIG. 4.

FIG. 5 illustrates examples of threshold voltages of memory cells programmed by the method of FIG. 4.

Before the program operation, the selected memory cells have threshold voltages corresponding to an erase state Er. For example, the range of the threshold voltage corresponding to the erase state Er may be lower than a ground voltage. The memory cells of the semiconductor memory device 50 may be programmed such that each has any one of a plurality of program states PV1 to PV7 depending on the data to be programmed. For example, as shown in FIG. 5, he selected memory cells are programmed such that each has a threshold voltage of any one among first to seventh program states PV1 to PV7.

Examples 501, 503 and 505 each illustrate a threshold voltage distribution of memory cells programmed to the erase state Er and first to seventh program states PV1 to PV7.

Example 501 shows the threshold voltage distribution of memory cells programmed by applying a program pulse voltage that is increased by an identical step voltage level every time the program pulse voltage is applied through an ISPP. For example, for 501 the level of the step voltage may be set to 0.4 V.

Example 503 shows a threshold voltage distribution of memory cells programmed by applying the program pulse voltage that is increased by a step voltage level linearly reducing every time the program pulse voltage is applied until the threshold voltages of the memory cells are higher than the program verification voltage through an ISPP. For example, for 503 the level of the step voltage may be reduced by 0.02 V for every program pulse from 0.6 V until the program states PV1 to PV7 are higher than corresponding program verification voltages Vp1 to Vp7. In the embodiment of example 503, when the program states are higher than the corresponding program verification voltages Vp1 to Vp7, a dummy pulse is applied, and then the program operation is completed.

Until threshold voltages of the memory cells are higher than the program verification voltage, the step voltage of example 503 is higher than that of example 501. Thus, as shown in examples 501 and 503, the threshold voltage distributions of the first to fourth program states PV1 to PV4 of example 503 is deteriorated compared to that of example 501 while the threshold voltage distributions of the fifth to seventh program states PV5 to PV7 of example 503, in which the step voltage is reduced to 0.4 V or less, is improved when compared to example 501.

The embodiment of 505 uses the same ISSP method as that of the embodiment of 503, but in the case of 505, the program operation is performed in such a way that when the dummy pulse is applied to the selected word line, a program control voltage is applied to the bit lines connected to the memory cells.

That is, in the embodiment of 505, when the dummy pulse is applied to the memory cells, the voltage applied to the bit lines is controlled so that the threshold voltages of the selected memory cells can be prevented from undesirably increasing. Therefore, it can be understood that the threshold voltage distribution of the fifth to seventh program states PV1 to PV7 is further improved.

According to the embodiments of the present disclosure, programming time can be reduced, and the threshold voltage distribution of the memory cells can be improved.

Figure 6:
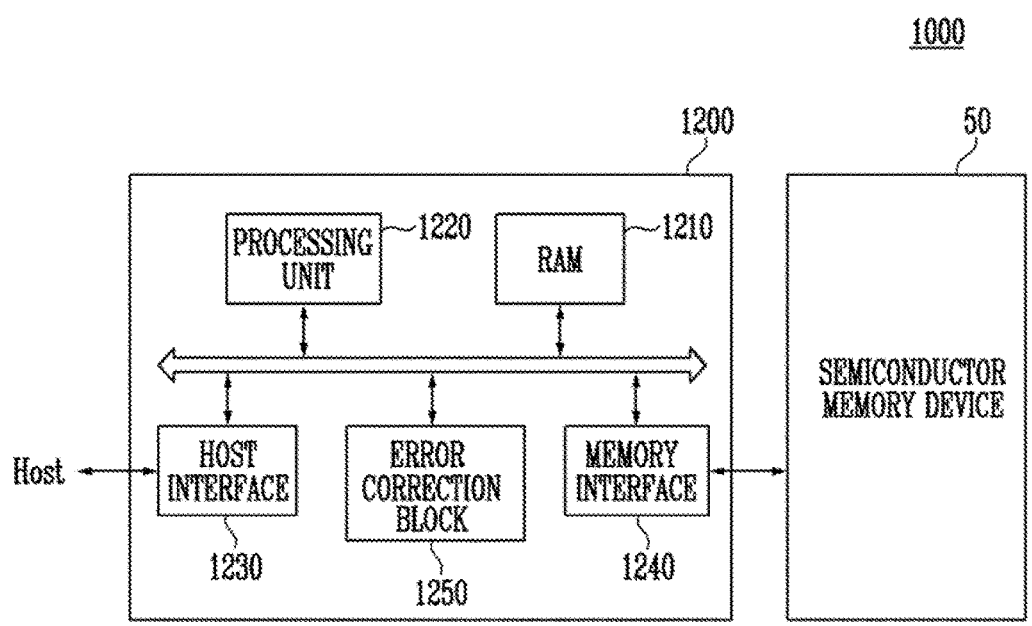
FIG. 6 is a block diagram showing a memory system including a semiconductor memory device, according to an embodiment of the invention.

FIG. 6 is a block diagram illustrating a memory system 1000 including the semiconductor memory device 50 of FIG. 1.

Referring to FIG. 6, the memory system 1000 includes the semiconductor memory device 50 and a controller 1200.

The semiconductor memory device 50 may have the same configuration and operation as the semiconductor memory device described with reference to FIG. 1. Hereinafter, repetitive explanations will be omitted.

The controller 1200 is connected to a host and the semiconductor memory device 50. In response to a request from the host, the controller 1200 accesses the semiconductor memory device 50. For example, the controller 1200 is configured to control read, write, erase, and background operations of the semiconductor memory device 50. The controller 1200 is configured to provide an interface between the host and the semiconductor memory device 50. The controller 1200 is configured to drive firmware for controlling the semiconductor memory device 50.

The controller 1200 includes RAM (random access memory) 1210, a processing unit 1220, a host interface 1230, a memory interface 1240, and an error correction block 1250.

The RAM 1210 is used as at least one of operating memory for the processing unit 1220, cache memory between the semiconductor memory device 50 and the host, and buffer memory between the semiconductor memory device 50 and the host.

The processing unit 1220 controls the overall operation of the controller 1200.

The processing unit 1220 is configured to randomize data provided from the host. For example, the processing unit 1220 may use a randomizing seed to randomize data provided from the host. Randomized data, which is data to be stored (DATA, refer to FIG. 1), is provided to the semiconductor memory device 50 and programmed in the memory cell array (100, refer to FIG. 1).

The processing unit 1220 is configured to de-randomize data provided from the semiconductor memory device 50 during a read operation. For example, the processing unit 1220 may use a de-randomizing seed to de-randomize data provided from the semiconductor memory device 50. De-randomized data may be output to the host.

In an embodiment, the processing unit 1220 may drive software or firmware to perform the randomizing or de-randomizing operation.

The host interface 1230 includes a protocol for performing data exchange between the host and the controller 1200. In an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a proprietary protocol, and the like.

The memory interface 1240 interfaces with the semiconductor memory device 50. For example, the memory interface includes a NAND interface or a NOR interface.

The error correction block 1250 uses an error correction code (ECC) to detect and correct errors in data provided from the semiconductor memory device 50.

The controller 1200 and the semiconductor memory device 50 may be integrated into a single semiconductor device. In an embodiment, the controller 1200 and the semiconductor memory device 50 may be integrated into a single semiconductor device to form a memory card. For example, the controller 1200 and the semiconductor memory device 50 may be integrated into a single semiconductor device and form a memory card such as a personal computer memory card international association (PCMCIA) card, a compact flash (CF) card, a smart media card (SMC), a memory stick multimedia card (MMC, RS-MMC, or MMCmicro), an SD card (SD, miniSD, microSD, or SDHC), a universal flash storage (UFS), and the like.

The controller 1200 and the semiconductor memory device 50 may be integrated into a single semiconductor device to form a solid state drive (SSD). The SSD includes a storage device formed to store data in semiconductor memory. When the memory system 1000 is used as the SSD, the operation speed of the host connected to the memory system 1000 may be phenomenally improved.

In another embodiment, the memory system 1000 may be provided as one of various elements of an electronic device such as a computer, a ultra mobile PC (UMPC), a workstation, a netbook, a personal digital assistant (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 50 or the memory system 1000 may be embedded in various types of packages. For example, the semiconductor memory device 50 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 7:
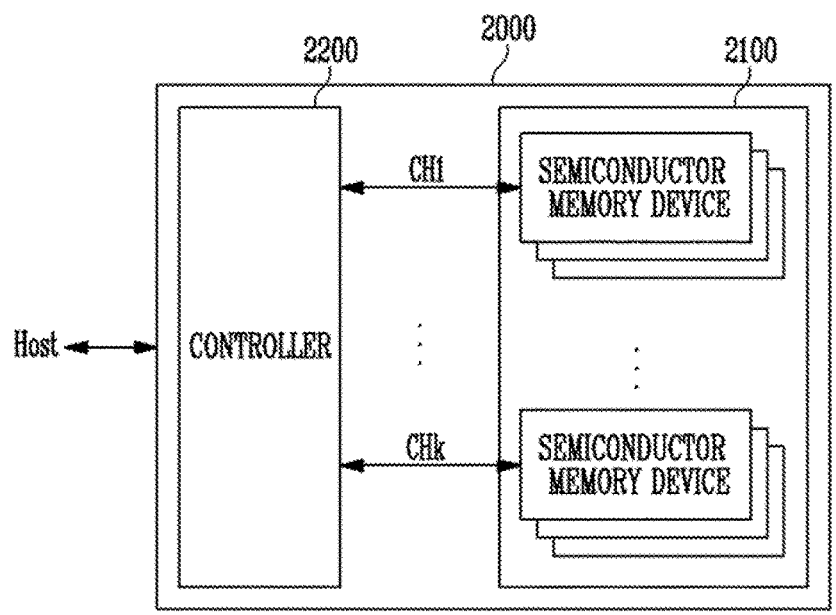
FIG. 7 is a block diagram showing an application example for a memory system, according to an embodiment of the invention.

FIG. 7 is a block diagram showing an application example 2000 of the memory system 1000 of FIG. 6.

Referring FIG. 7, the memory system 2000 includes a semiconductor memory device 2100 and a controller 2200. The semiconductor memory device 2100 includes a plurality of memory chips. The semiconductor memory chips are divided into a plurality of groups.

In FIG. 7, it is illustrated that each of the plurality of groups communicates with the controller 2200 through first to k-th channels CH1 to CHk. Each semiconductor memory chip is configured to operate in the same manner as that of an embodiment of the semiconductor memory device 50 described with reference to FIG. 1.

Each group communicates with the controller 2200 through one common channel. The controller 2200 has the same configuration as that of the controller 1200, described with reference to FIG. 6, and is configured to control a plurality of memory chips of the semiconductor memory device 2100 through the plurality of channels CH1 to CHk.

In FIG. 7, a plurality of semiconductor memory chips is illustrated as being connected to each channel. However, it will be understood that the memory system 2000 may be configured such that a single memory chip is connected to each channel.

Figure 8:
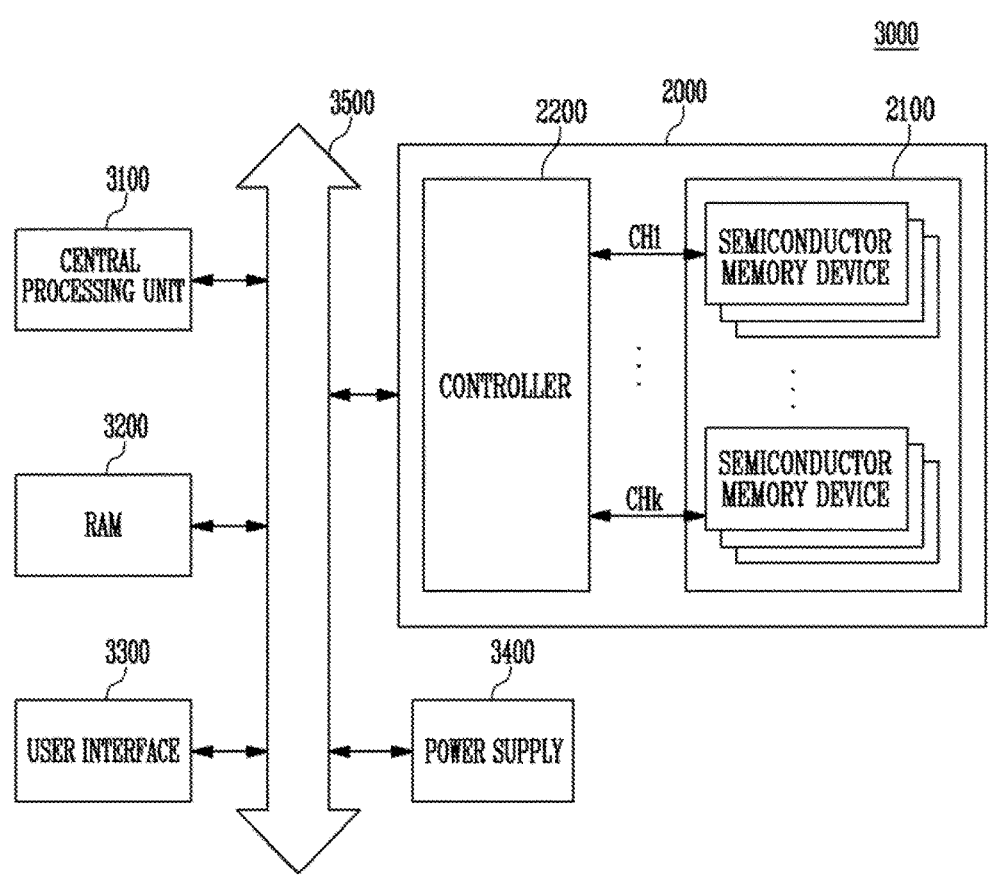
FIG. 8 is a block diagram showing a computing system including a memory system, according to an embodiment of the invention.

FIG. 8 is a block diagram illustrating a computing system 3000 including the memory system 2000 explained in relation to FIG. 7.

Referring to FIG. 8, the computing system 3000 includes a central processing unit 3100, RAM 3200, a user interface 3300, a power supply 3400, a system bus 3500, and a memory system 2000.

The memory system 2000 is electrically connected to the CPU 3100, the RAM 3200, the user interface 3300, and the power supply 3400 through the system bus 3500. Data provided through the user interface 3300 or processed by the CPU 3100 is stored in the memory system 2000.

In FIG. 8, the semiconductor memory device 2100 is illustrated as being connected to the system bus 3500 through the controller 2200. However, the semiconductor memory device 2100 may be directly connected to the system bus 3500. The function of the controller 2200 may be performed by the CPU 3100 and the RAM 3200.

In FIG. 8, the memory system 2000 described with reference to FIG. 7 is illustrated as being used. However, the memory system 2000 may be replaced with the memory system 1000 described with reference to FIG. 8. In an embodiment, the computing system 3000 may include all of the memory systems 1000 and 2000, described with reference to FIGS. 6 and 7.

Various embodiments of the present disclosure can provide a semiconductor memory device which has enhanced program speed and reliability, and an operating method thereof.

Although the exemplary embodiments of the present invention have been disclosed, those skilled in the art will appreciate that various modifications, additions and substitutions are possible, without departing from the scope and spirit of the invention.

In the above-discussed embodiments, all steps may be selectively performed or skipped. In addition, the steps in each embodiment may not always be performed in regular order. Furthermore, the embodiments disclosed in the present specification and the drawings just aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Meanwhile, exemplary embodiments of the present invention have been described with reference to the accompanying drawings, and specific terms or words used in the description should be construed in accordance with the spirit of the present invention without limiting the subject matter thereof. It should be understood that many variations and modifications of the basic inventive concept described herein will still fall within the spirit and scope of the present disclosure as defined in the appended claims.

What is claimed is:

1. A method of operating a semiconductor memory device including a plurality of memory cells connected to a word line, the method comprising:
applying a program pulse to the word line;
performing a program verification operation to the plurality of memory cells using a first program verification voltage;
repeating the applying of the program pulse and the performing the program verification operation until program verification passes by increasing a level of the program pulse by an amount of a step voltage at each repetition;
determining, when the program verification passes, a dummy pulse voltage; and
applying the dummy pulse voltage to the word line,
wherein the step voltage decreases at each repetition.

2. The method according to claim 1, wherein the step voltage is greater than a difference between a maximum value and a minimum value of a threshold voltage distribution of a target program state of the plurality of memory cells.

3. The method according to claim 1, wherein the first program verification voltage is less than a minimum value of a threshold voltage distribution of a target program state of the plurality of memory cells.

4. The method according to claim 1, wherein performing a program verification operation further comprises determining the program verification to pass when threshold voltages of the plurality of memory cells are higher than the first program verification voltage.

5. The method according to claim 1, wherein the step voltage linearly decreases at each repetition of the applying the program pulse.

6. The method according to claim 1, wherein the dummy pulse voltage is higher by an amount of a preset voltage than a last one among program pluses applied to the word line during the repetition.

7. The method according to claim 6, wherein the preset voltage is a difference value between the first program verification voltage and a median value of a threshold voltage distribution of a target program state of the plurality of memory cells.

8. The method according to claim 1, further comprising performing the program verification to the plurality of memory cells using a second program verification voltage after the applying of the dummy pulse.

9. The method according to claim 8, wherein the second program verification voltage is any one of a median value and a minimum value of a threshold voltage distribution of a target program state of the plurality of memory cells.

10. A semiconductor memory device comprising:
a plurality of memory cells connected to one or more word lines;
a peripheral circuit suitable for applying a program pulse to at least one of the one or more word lines, performing a program verification operation to at least one or more of the plurality of memory cells by using a first program verification voltage; and
a control logic suitable for controlling the peripheral circuit to repeat the applying of the program pulse and the performing the program verification operation until program verification passes by increasing a level of the program pulse by an amount of a step voltage at each repetition and to apply a dummy pulse to the word line when the program verification passes,
wherein a size of the step voltage decreases at each repetition.

11. The semiconductor memory device according to claim 10, wherein the step voltage is greater than a voltage width of a threshold voltage distribution of a target program state of the plurality of memory cells.

12. The semiconductor memory device according to claim 10, wherein the first program verification voltage is less than a minimum value of a threshold voltage distribution of a target program state of the plurality of memory cells.

13. The semiconductor memory device according to claim 10, wherein the peripheral circuit performs the program verification operation by determining the program verification to pass when threshold voltages of the plurality of memory cells are higher than the first program verification voltage.

14. The semiconductor memory device according to claim 10,
wherein the control logic further controls the peripheral circuit to apply a program control voltage to bit lines connected to the plurality of memory cells when the program verification passes,
wherein the program control voltage is higher than a ground voltage and lower than a power supply voltage.

15. The semiconductor memory device according to claim 10, wherein a level of the dummy pulse voltage is higher by an amount of a preset voltage than a last one among program pluses applied to the word line during the repetition.

16. The semiconductor memory device according to claim 15, wherein the preset voltage is a difference value between the first program verification voltage and a median value of a threshold voltage distribution of a target program state of the plurality of memory cells.

17. The semiconductor memory device according to claim 16, wherein the control logic further controls the peripheral circuit to perform the program verification to the plurality of memory cells using a second program verification voltage after the applying of the dummy pulse.

18. The semiconductor memory device according to claim 17, wherein the second program verification voltage is any one of a median value and a minimum value of a threshold voltage distribution of a target program state of the plurality of memory cells.

* * * * *